(12) United States Patent
Yamamoto et al.

(10) Patent No.: US 8,115,114 B2
(45) Date of Patent: Feb. 14, 2012

(54) CERAMIC SUBSTRATE MANUFACTURING METHOD AND CERAMIC SUBSTRATE

(75) Inventors: Yasuyuki Yamamoto, Yamaguchi (JP); Ken Sugawara, Yamaguchi (JP); Masakatsu Maeda, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 344 days.

(21) Appl. No.: 12/439,233

(22) PCT Filed: Sep. 5, 2007

(86) PCT No.: PCT/JP2007/067314
§ 371 (c)(1),
(2), (4) Date: Feb. 27, 2009

(87) PCT Pub. No.: WO2008/029847
PCT Pub. Date: Mar. 13, 2008

(65) Prior Publication Data
US 2010/0012368 A1    Jan. 21, 2010

(30) Foreign Application Priority Data

Sep. 6, 2006    (JP) .................................. 2006-241393

(51) Int. Cl.
H05K 1/11 (2006.01)
(52) U.S. Cl. ........................................................ 174/266
(58) Field of Classification Search .................. 174/266, 174/260, 52.4, 259; 361/761–764; 257/710, 257/708, 690, 703
See application file for complete search history.

(56) References Cited

U.S. PATENT DOCUMENTS

| | | | | |
|---|---|---|---|---|
| 4,665,468 | A * | 5/1987 | Dohya | 361/794 |
| 4,736,521 | A * | 4/1988 | Dohya | 29/830 |
| 5,488,542 | A * | 1/1996 | Ito | 361/793 |
| 6,610,934 | B2 * | 8/2003 | Yamaguchi et al. | 174/264 |
| 7,071,551 | B2 * | 7/2006 | Hiramatsu et al. | 257/710 |
| 2002/0180027 | A1 * | 12/2002 | Yamaguchi et al. | 257/700 |
| 2003/0170415 | A1 * | 9/2003 | Hiramatsu et al. | 428/64.1 |
| 2007/0158101 | A1 * | 7/2007 | Chikagawa et al. | 174/260 |
| 2010/0018630 | A1 * | 1/2010 | Uematsu et al. | 156/89.12 |

FOREIGN PATENT DOCUMENTS

| | | |
|---|---|---|
| JP | 63-261796 A | 10/1988 |
| JP | 11-135906 A | 5/1999 |
| JP | 11-340628 A | 12/1999 |
| JP | 2001-358466 A | 12/2001 |
| JP | 2005-203641 A | 7/2005 |

OTHER PUBLICATIONS

European Search Report: Application No. EP 07 80 6757.

* cited by examiner

*Primary Examiner* — Jean F Duverne
(74) *Attorney, Agent, or Firm* — Ladas & Parry LLP (57) ABSTRACT

A method for manufacturing a ceramic substrate having a via hole(s) and a surface wiring pattern electrically connected to the via hole(s). The method includes: preparing a sintered ceramic substrate having a via hole(s); forming over the sintered ceramic substrate a sintered ceramic layer having a hole(s) or opening(s) whose bottom is configured to be at least a part of an exposed end surface of the via hole(s) by post-firing method; forming inside the hole(s) or opening(s) a conductive portion which electrically connects the surface of the sintered ceramic layer and the via hole(s); and forming over the surface of the sintered ceramic layer a surface wiring pattern electrically connected to the conductive portion.

8 Claims, 4 Drawing Sheets

CERAMIC SUBSTRATE MANUFACTURING METHOD AND CERAMIC SUBSTRATE

TECHNICAL FIELD

The present invention relates to a ceramic substrate manufacturing method and the ceramic substrate manufactured by the method. Particularly, the invention relates to a method for manufacturing a ceramic substrate which has via hole(s) and a surface wiring pattern electrically connected thereto and which can accurately control the position of the surface wiring pattern; and the invention relates to a ceramic substrate with via hole(s) having a surface wiring pattern positioned with a high degree of accuracy.

BACKGROUND ART

As a method for manufacturing a ceramic substrate having via holes, co-firing method (simultaneous firing method) and post-firing method (sequential firing method) are known. The method for manufacturing a substrate with via holes by co-firing method is a method including the steps of: forming a through hole in the pre-firing ceramic substrate precursor, i.e. the so-called "green sheet"; filling a metal paste into the through hole to produce a ceramic substrate precursor; thereafter, firing the obtained ceramic substrate precursor. By the method, firing of the green sheet and the conductive paste in the via hole is carried out simultaneously.

Meanwhile, post-firing method means a method including the steps of: applying a metal paste and a ceramic paste over a fired ceramic substrate; and then, firing the paste together with the sintered substrate. The method for manufacturing a substrate with via holes by post-firing method is a method including the steps of: piercing a sintered ceramic substrate obtained by firing a green sheet by laser method, machining, and the like to form through holes; filling a conductive paste in the through hole to form a ceramic substrate precursor; and firing the ceramic substrate precursor. By the method, firing of the green sheet and the conductive paste in the via holes is carried out sequentially.

For example, Patent document 1 discloses a method for manufacturing an aluminum nitride substrate by co-firing method. Patent Document 1: Japanese Patent Application Laid-Open (JP-A) No. 11-135906

DISCLOSURE OF THE INVENTION

Problems to be Solved by the Invention

In the post-firing method, since the sintered substrate is pierced by laser and the like so that accuracy of hole positioning is high; on the other hand, when the sintered substrate is thick, due to the characteristics of laser, hole size in the front face and back face of the pierced sintered substrate becomes different, which is problematic. Moreover, when the metal paste in the via is post-fired, if the paste shrinks so that the surface of the via sinks in, if metal paste connects on its own to the inner wall of the pierced hole at a time of post-firing so that through hole is made in the center portion of the via, or if a generous amount of the paste is filled in advance for preventing sinking, surface of the via projects, which requires polishing treatment, which is also problematic. Further, as the post-firing method requires piercing of the sintered substrate, compared with the co-firing method, number of piercing step is larger, the pierced hole-size is larger, or piercing to the thicker substrate is difficult. Therefore, the post-firing method is industrially disadvantageous.

In the co-firing method, the green sheet tends to inhomogeneously shrink at a time of firing, thus, for example, in a case where a square green sheet is sintered, each side of the square shrinks such that center portion thereof warps towards inner side of the square; thereby the substrate is slightly deformed in substantially starburst shape. Therefore, when one wants to make a plurality of the same ceramic substrates at the same time by using a piece of green sheet base material, depending on the position of the ceramic substrate in the base material, via hole positions may be changed, which is problematic.

As for the substrate for mounting electronic parts, with miniaturization of parts to be mounted, higher accuracy and higher fineness is required of making surface wiring patterns. For instance, if a minute part like a semi-conductor laser element is required to be mounted at a certain position with a high degree of accuracy, the wiring pattern to be an element mounting portion is also required to satisfy strict accuracy in positioning and surface smoothness. Accordingly, connecting point between the surface wiring pattern and the via holes is also required to control the positions with a high degree of accuracy and assure the electrical connection.

Accordingly, an object of the present invention is to provide a method for manufacturing a ceramic substrate employing co-firing method, which can control the position of connecting point of a surface wiring pattern and a via hole with a high degree of accuracy and which can correspond to a highly accurate wiring pattern formed on a ceramic substrate.

Means for Solving the Problems

The present inventors had seriously studied about the above problems. As a result, the inventors had discovered that the above problems can be solved by forming over the co-fired substrate having via hole(s) an insulating layer having hole(s) or opening(s) at the predetermined position by post-firing method and completed the following invention.

The first aspect of the present invention is a method for manufacturing ceramic substrate (200A) used for manufacturing a ceramic substrate (200C, 200D, or 200E) having via hole(s) (30) and a surface wiring pattern (52, 54, 56, or 70) electrically connected to the via hole(s), the method comprising the steps of: preparing a sintered ceramic substrate (10) having via hole(s) (30); and forming over the sintered ceramic substrate (10) a sintered ceramic layer (20) having hole(s) or opening(s) (24) whose bottom is configured to be at least a part of exposed end surface of the via hole(s) (30) by post-firing method.

The second aspect of the present invention is a method for manufacturing a ceramic substrate (200C, 200D, or 200E) having via hole(s) (30) and a surface wiring pattern (52, 54, 56, or 70) electrically connected to the via hole(s), the method comprising the steps of: preparing a sintered ceramic substrate (10) having via hole(s) (30); forming over the sintered ceramic substrate (10) a sintered ceramic layer (20) having hole(s) or opening(s) (24) whose bottom is configured to be at least a part of exposed end surface of the via hole(s) (30) by post-firing method; forming inside the hole(s) or opening(s) (24) a conductive portion (40) which electrically connects the surface of the sintered ceramic layer (20) and the via hole(s) (30) and forming over the surface of the sintered ceramic layer (20) a surface wiring pattern (52, 54, 56, or 70) electrically connected to the conductive portion (40). It should be noted that in the first and second aspects of the invention, "bottom is configured to be at least a part of exposed end surface of the via hole(s) (30)" means that surface of the via hole(s) (30) and bottom of the hole(s) or opening(s) (24) are overlapped in at least a part of those area when the ceramic substrate is seen at a planar view.

In the second aspect of the invention, the step for preparing the sintered ceramic substrate (10) having via hole(s) (30) may comprise the steps of: piercing the ceramic green sheet (12) at the predetermined position; filling a metal paste (32) into the pierced hole(s) to form a first precursor (100); and firing the first precursor to form a second precursor (110) having via hole(s) (30). It should be noted that the second precursor (110) and the sintered ceramic substrate (10) having the via hole(s) (30) are the same. In addition, the step for forming the sintered ceramic layer (20) by post-firing method may comprise the steps of: forming over the sintered ceramic substrate (10) having via hole(s) (30) a ceramic paste layer (22) having hole(s) or opening(s) (24) whose bottom is configured to be at least a part of exposed end surface of the via hole(s) (30); and firing the ceramic paste layer (22).

When a sintered ceramic substrate (corresponding to the second precursor (110)) is manufactured by piercing the ceramic green sheet (12) at the predetermined positions, filling the pierced hole(s) with the metal paste (32), and then firing the obtained sheet by co-firing method, the substrate is shrunk at the time of firing so that positions of the via hole(s) (30) become misaligned. The invention of the first and second aspects is manufactured by firing, over the surface of the sintered ceramic substrate (10) produced by the co-firing method, the ceramic paste layer (22) having hole(s) or opening(s) (24) whose bottom is configured to be at least a part of exposed end surface of the via hole(s) (30) and to form the sintered ceramic layer (20) by post-firing method. The above hole(s) or opening(s) (24) is(are) not necessarily provided just above the corresponding via hole(s) (30), a part of the bottom may be configured to be the end surface of the via hole(s) (30). Thus, positions of the hole(s) can be freely adjusted within the tolerance depending on the diameter of the hole(s) or opening(s) (24). By providing the position of the hole(s) or opening(s) (24) at the area where is planned to become connecting point between the surface wiring pattern (52, 54, 56, or 70) and the via hole(s) (30), forming the conductive portion (40) being extended in the surface of the sintered ceramic layer (20) within the hole(s) or opening(s) (24) and electrically connected to the via hole(s) (30), and connecting the conductive portion (40) and the surface wiring pattern (52, 54, 56, or 70), it is possible to surely electrically connects the via hole(s) (30) and the surface wiring pattern (52, 54, 56, or 70). In other words, the method is capable of correcting the position of the via hole(s) (30) misaligned by shrinkage at the time of firing of co-firing method; hence, it is possible to manufacture a ceramic substrate responding to fine wiring pattern.

In the second aspect of the invention, the ceramic for forming the ceramic green sheet (12) and the ceramic paste layer (22) is preferably aluminum nitride. Aluminum nitride is a material of favorable heat conductance. So, by using aluminum nitride as a ceramic composing the substrate, when elements are mounted on the substrate, it is possible to efficiently discharge heat which is discharged from the elements to the outside.

In the second aspect of the invention, forming of the conductive portion (40) and the sintered ceramic layer (20) can be carried out simultaneously. For example, in the step for forming the sintered ceramic layer (20) by post-firing method, by filling metal paste into the hole(s) or opening(s) (24) to form a metal paste layer and firing the obtained metal paste layer together with the ceramic paste layer (22), forming of the conductive portion and the sintered ceramic layer can be carried out simultaneously. By employing such a method, it is possible to obtain a substrate whose surface before forming of the surface wiring pattern is flat. Depending on the applications, surface flatness of the ceramic substrate is required; therefore, by employing the method, such a requirement can be responded.

In addition, about the above method, formation of the ceramic paste layer (22) and formation of the metal paste layer are repeated alternately, together with this, first hole(s) or first opening(s) (24A) is (are) provided in the first ceramic paste layer (22A) such that the diameter(s) is(are) to become larger than that(those) of the via hole(s) (30) so that the bottom of the first hole(s) or first opening(s) (24A) covers the entire area of the end surface of the via hole(s) (30), further, upper hole(s) or upper opening(s) (24B, 24C, . . . ) is(are) provided in a ceramic paste layer (22B, 22C, . . . ) to be formed over the first layer (22A) such that the diameter(s) is(are) to become smaller than that(those) of metal paste layer existing underneath the ceramic paste layer in order to form the entire area of the bottom of the upper hole(s) or upper opening(s) (24B, 24C, . . . ) with the surface of the metal paste layer. By doing this, it becomes possible to extend the tolerance for positioning adjustment of the hole(s) or opening(s) (24); it is also possible to respond to the case where positions of the via hole(s) (30) are largely misaligned by shrinkage. Moreover, when lowering the electrical resistance, the via hole(s) (30) and the corresponding surface wiring pattern (52, 54, 56, or 70) can be surely and electrically connected.

Moreover, in the second aspect of the invention, forming of the conductive portion (40) and the surface wiring pattern (52, 54, 56, or 70) can be carried out simultaneously. For instance, by employing thin film method, in a case where a metal film (to be the surface wiring pattern) is formed at once on the bottom and side of the hole(s) or opening(s) (24) as well as surface of the sintered ceramic layer (20), the metal film formed on the bottom and side of the hole(s) or opening(s) (24) becomes the conductive portion.

Further, in the second aspect of the invention, forming of the conductive portion (40), the sintered ceramic layer (20), and the surface wiring pattern (52, 54, 56, or 70) can be carried out simultaneously. In this respect, after forming ceramic paste layer (22) having the hole(s) or opening(s) (24), the hole(s) or opening(s) (24) may be filled with the metal paste, then pattern printing for making wiring patterns may be carried out by using metal paste; thereafter, all of these may be fired simultaneously.

Figure 3A:
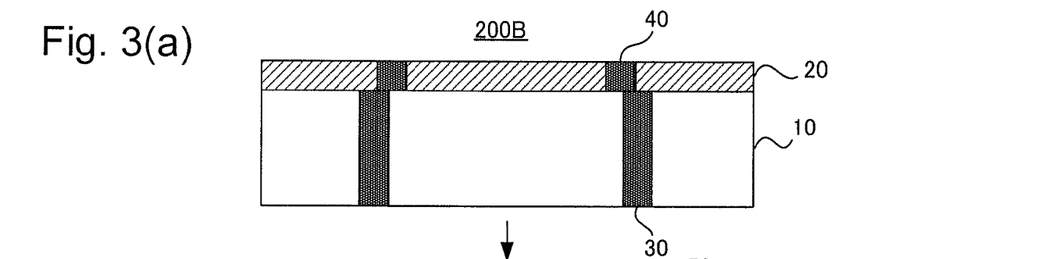
FIGS. 3(a) to 3(e) are explanatory views showing forming steps of wiring patterns in the method for manufacturing the ceramic substrate of the invention.
Figure 3B:
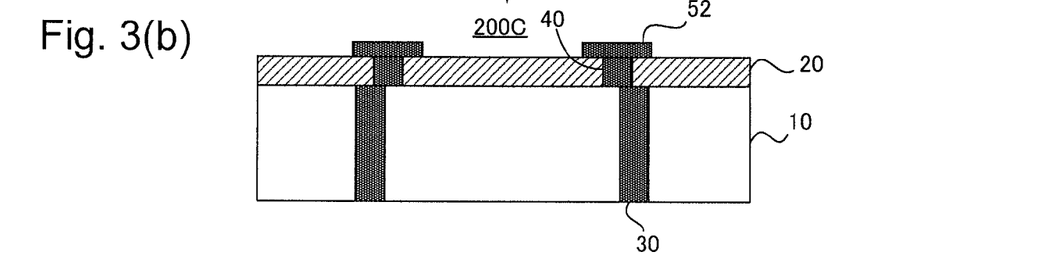
Figure 3C:
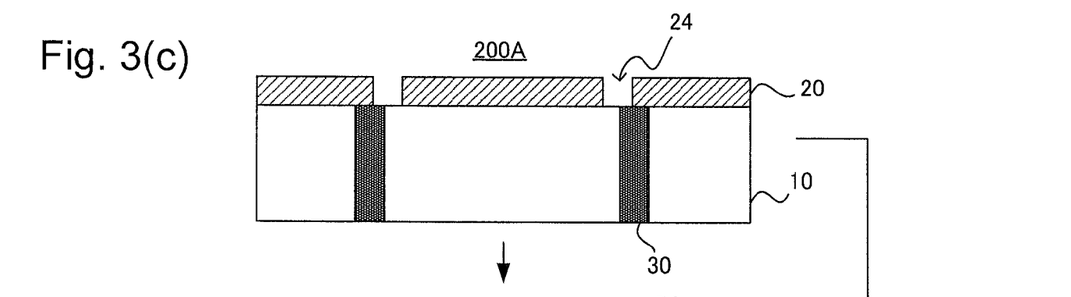
Figure 3D:
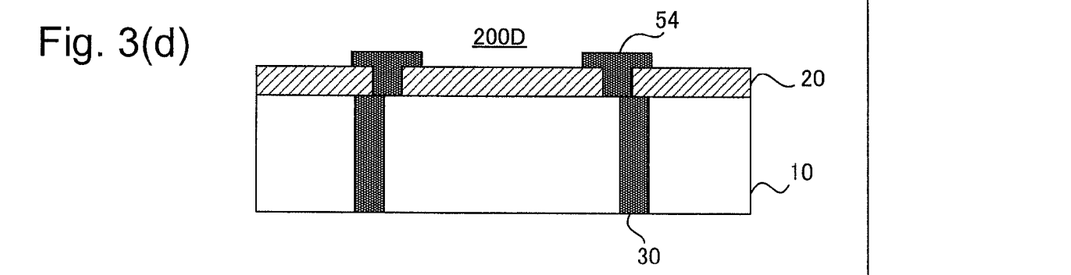
Figure 3E:
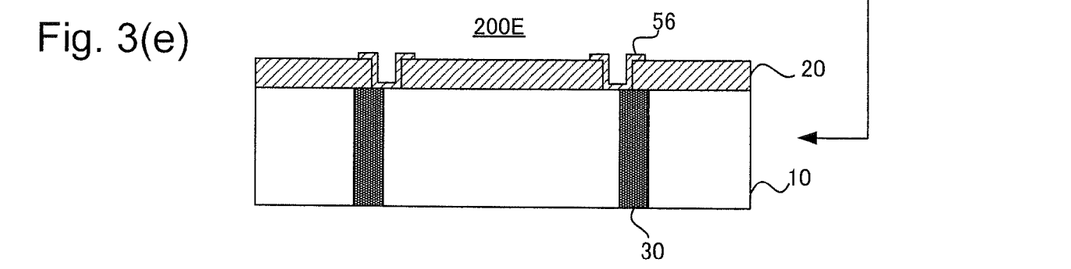

Still further, in the second aspect of the method for manufacturing the ceramic substrate of the invention, the step of forming the surface wiring pattern (52, 54, 56, or 70) may be suitably adopted from either method having the steps of printing the metal paste, firing the printed metal paste, and the plating over the surface thereof (See FIGS. 3(b), 3(d).) or the method having the step of forming a metallized layer to be the wiring pattern by thin film method (See FIG. 3(e).).

The third aspect of the present invention is a ceramic substrate (200A) comprising: a sintered ceramic substrate (10) having via hole(s) (30) formed by co-firing method; and a sintered ceramic layer (20) formed over the sintered ceramic substrate (10) by post-firing method, the sintered ceramic layer (20) having hole(s) or opening(s) (24) whose bottom is configured to be at least a part of exposed end surface of the via hole(s) (30). The substrate is useful for a ceramic substrate used for manufacturing the ceramic substrate having via hole(s) (30) and a surface wiring pattern (52, 54, 56, or 70) for electrically connects the via hole(s) (30).

The fourth aspect of the present invention is a ceramic substrate comprising: a sintered ceramic substrate (10) having via hole(s) (30) formed by co-firing method; a sintered ceramic layer (20) formed over the sintered ceramic substrate (10) by post-firing method; and a surface wiring pattern (52, 54, 56, or 70) formed over the sintered ceramic layer (20) and electrically connected to the via hole(s) (30), the sintered ceramic layer (20) having the hole(s) or opening(s) (24) whose bottom is configured to be at least a part of exposed end surface of the via hole(s) (30), conductive portion(s) (40) which electrically connects the via hole(s) (30) and the surface wiring pattern (52, 54, 56, or 70) being formed inside the hole(s) or opening(s) (24).

EFFECTS OF THE INVENTION

When the sintered ceramic substrate (corresponding to the second precursor (110)) is manufactured by piercing the ceramic green sheet (12) at the predetermined positions, filling the pierced hole(s) with the metal paste (32), and then firing the obtained sheet by co-firing method, the substrate is shrunk at the time of firing so that positions of the via hole(s) (30) become misaligned. The first and second aspects of the invention is manufactured by firing, over the surface of the sintered ceramic substrate produced by the co-firing method, the ceramic paste layer (22) having hole(s) or opening(s) (24) whose bottom is configured to be at least a part of exposed end surface of the via hole(s) (30) and forming the sintered ceramic layer (20) by post-firing method. The above hole(s) or opening(s) (24) is(are) not necessarily provided just above the via hole(s) (30), at least a part of the bottom may be configured to be the end surface of the via hole(s) (30); thus, positions of the hole(s) can be freely adjusted within the tolerance depending on the diameter of the hole(s) or opening(s) (24). By providing the position of the hole(s) or opening(s) (24) at the area where is planned to become connecting point between the surface wiring pattern (52, 54, 56, or 70) and the via hole(s) (30), forming the conductive portion (40) being extended in the surface of the sintered ceramic layer (20) within the hole(s) or opening(s) (24) and electrically connected to the via hole(s) (30), and connecting the conductive portion (40) and the surface wiring pattern (52, 54, 56, or 70), it is possible to surely electrically connects the via hole(s) (30) and the surface wiring pattern (52, 54, 56, or 70). In other words, the method is capable of correcting the position of the via hole(s) (30) misaligned by shrinkage at the time of firing of co-firing method; hence, it is possible to manufacture a ceramic substrate responding to fine wiring patterns.

DESCRIPTION OF THE REFERENCE NUMERALS 10 sintered ceramic substrate
12 ceramic green sheet
20 sintered ceramic layer
22 ceramic paste layer
24 hole or opening
30 via hole
32 metal paste
40 conductive portion
70 surface wiring pattern on the conductive portion
72 outer wiring pattern
100 first precursor
110 second precursor
200A to 200E ceramic substrate

BEST MODE FOR CARRYING OUT THE INVENTION

Hereinafter, the present invention will be more specifically described by way of the following examples shown in the drawings.

First of all, an outline of the method for manufacturing the ceramic substrate of the invention will be described based on FIG. 1.

Figure 1A:
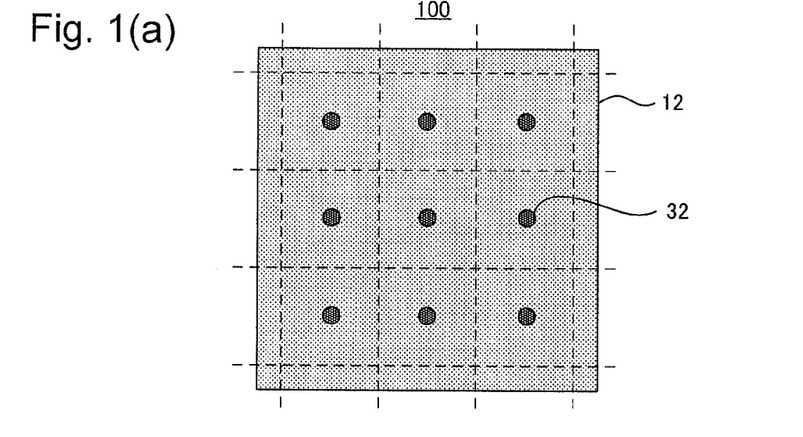
FIGS. 1(a), 1(b), and 1(c) are explanatory views showing a basic concept of the present invention.
Figure 1B:
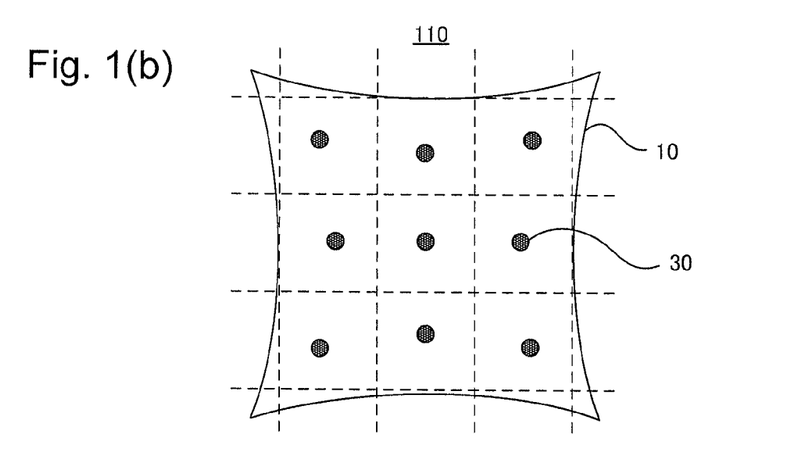

FIG. 1(a) is a plain view of a first precursor 100 in which a ceramic green sheet 12 is pierced at the predetermined positions and the pierced holes are filled with a metal paste 32. The ceramic green sheet 12 shown in FIG. 1(a) is a base material for forming a plurality of ceramic substrates and the ceramic green sheet is cut along the shown dotted lines to make nine ceramic substrates. In the process of FIG. 1(a), primarily, center of each ceramic substrate is pierced, and then, the pierced holes are filled with the metal paste.

The first precursor 100 is fired to make a sintered ceramic substrate 10 (second precursor 110) having a plurality of via holes 30. FIG. 1(b) is a plain view of the second precursor 110. The first precursor 100 is shrunk inhomogeneously by firing. For example, as shown in FIG. 1(b), shrinkage is caused such that center portion of each side of the precursor warps into the inner direction; as a result, the substrate deforms into starburst shape. With regard to each ceramic substrate to be formed by cutting the second precursor along the dotted lines, due to the deformation, position of via hole 30 is misaligned from center of the ceramic substrate. If position of the via hole 30 is misaligned from the desired position, when forming a precision wiring pattern on the substrate, short between wirings and contact failure are sometimes caused, which is problematic.

From these points of view, about wiring substrate on which formation of precision wiring pattern is required, positioning of via holes 30 must be accurately controlled. In order to respond to these requirement, in the method for manufacturing the ceramic substrate of the invention, as shown in FIG. 1(c), a sintered ceramic layer 20 having holes or openings 24 at the predetermined positions is formed over the surface of the substrate. The predetermined holes or openings 24 are formed at the positions where via holes 30 had been expected to be formed (i.e. a position being supposed to be connecting point of surface wiring pattern and via hole 30); therefore, the holes or openings 24 may be overlapped in at least a part of via holes 30.

The holes or openings 24 are connecting points to the wiring patterns; a metal layer to be the conductive portion 40 may be formed within the holes or openings 24 to form a wiring pattern thereon or the wiring patterns may be directly formed (in this case, wiring patterns exist within the holes or openings 24 function as conductive portion 40 and outer wiring patterns of the holes or openings 24 function as surface wiring pattern). When bottom of the holes or openings 24 and end surface of the via holes 30 are overlapped each other in at least a part of the area, issue in significant electrical resistance is not caused. For instance, the holes or openings 24 shown in the upper right, lower right, upper left, and lower left of FIG. 1(*c*) only overlap a part of the via holes 30; nevertheless, there is no problem of electrical resistance so that favorable connection with the wiring patterns can be attained. In order to make the electrical resistance smaller, as shown in FIG. 5, holes or openings 24 may have a structure of continuous or stepwise diameter-reduction towards the surface (upward direction in the FIG. 5), the entire area of the end surface of the via holes 30 may be included within the bottom area of the first holes or first openings 24A.

Figure 5:
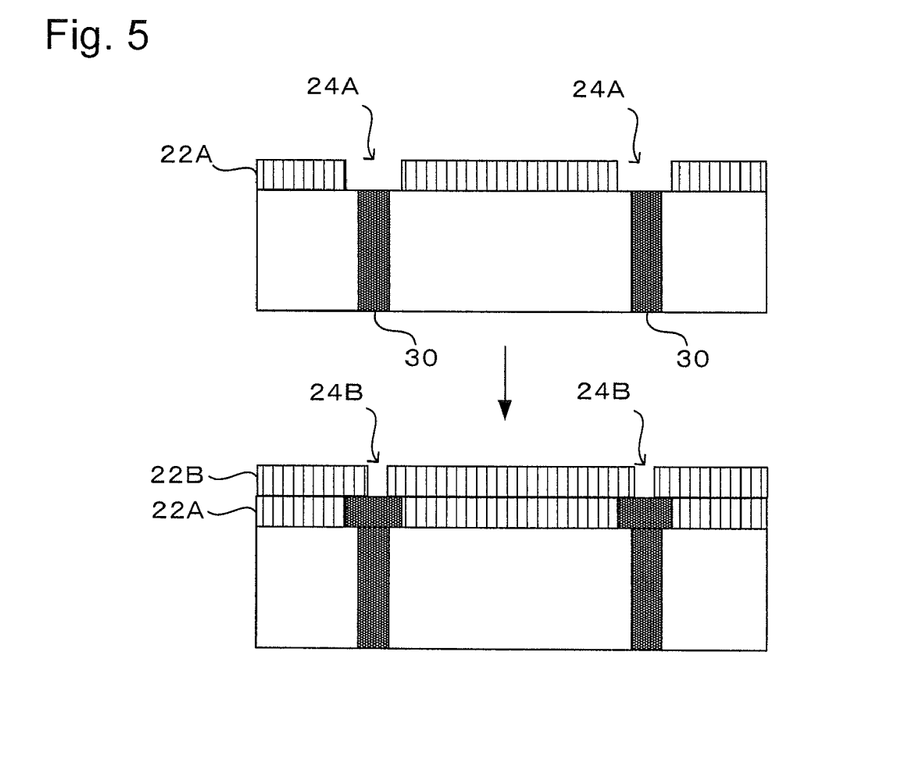
FIG. 5 is an explanatory view showing an outline of an example of the method for manufacturing the ceramic substrate of the invention.

In the manufacturing method shown in FIG. 5, firstly, a ceramic paste layer 22A is formed as a first layer. In order to include the entire area of the end surface of the via holes 30, the first holes or first openings 24A are formed in the ceramic paste layer 22A. In the first holes or first openings 24A, metal paste layers are formed. Thereafter, over the ceramic paste layer 22A having the first holes or first openings 24A in each of which a metal paste layer is formed, a ceramic paste layer 22B is formed. In the ceramic paste layer 22B, upper holes or upper openings 24B whose diameter is smaller than that of the metal paste layer is formed. The upper holes or upper openings 24B are formed such that the entire area of the bottom thereof is filled with the metal paste layer.

It should be noted that although FIG. 5 shows an embodiment having two ceramic paste layers 22A, 22B, another embodiment having two or more ceramic paste layers (multi-layers) (22A, 22B, ...) may be possible. In such a case, the higher the level of layers becomes, the smaller the diameter of holes or openings (24A, 24B, ...) becomes. In addition, the entire area of the bottom of the upper holes or upper openings (24B, ...) is formed by the surface of the metal paste existing in the layer underneath.

Figure 1C:
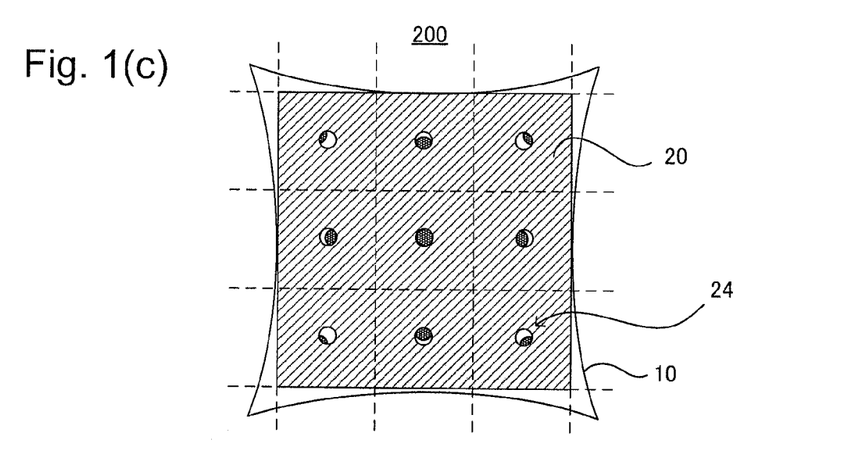

The sintered ceramic layer 20 formed in the FIG. 1(*c*) is formed by post-firing method, in which a ceramic paste is applied onto the already sintered ceramic substrate 10 and is fired. This makes it possible to inhibit shrinkage during the firing, thereby holes or openings 24 can be formed at desirable positions. Consequently, according to the manufacturing method of the present invention, by contacting the holes or openings 24 formed at the desired positions and the via holes 30 in at least a part thereof to electrically connect to the surface wiring patterns (52, 54, 56, or 70) through conductive portions 40 formed inside the holes or openings 24, it is possible to correct the position of the misaligned via holes 30 to the original position and to manufacture a ceramic substrate capable of responding to a hyperacute wiring pattern.

<Manufacturing Method of Ceramic Substrate>

FIGS. 2(*a*) to 2(*e*) are explanatory views showing an outline of each step of the method for manufacturing the ceramic substrate of the present invention. The method for manufacturing the ceramic substrate of the invention comprises the step of forming over a sintered ceramic substrate 10 (a second precursor 110) having via holes 30 a sintered ceramic layer 20 having holes or openings 24 at the connecting points with wiring patterns by post-firing method. More specifically, the method comprises the steps of forming the sintered ceramic substrate 10 (the second precursor 110) having the via holes 30 (FIGS. 2(*a*), 2(*b*)) and forming the sintered ceramic layer 20 thereon (FIGS. 2(*c*), 2(*d*)). As below, the manufacturing method will be described on a step-by-step basis.

(Formation of the Second Precursor 110)

Figure 2A:
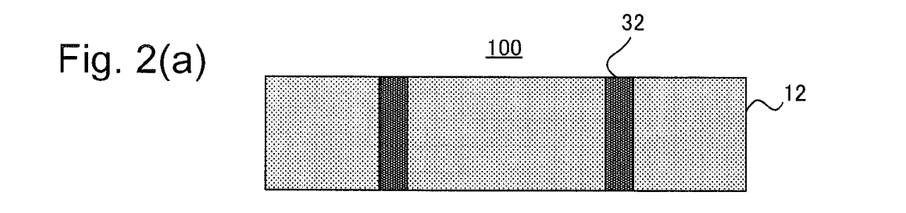
FIGS. 2(a) to 2(e) are explanatory views showing an outline of each step of the method for manufacturing the ceramic substrate of the invention.
Figure 2B:
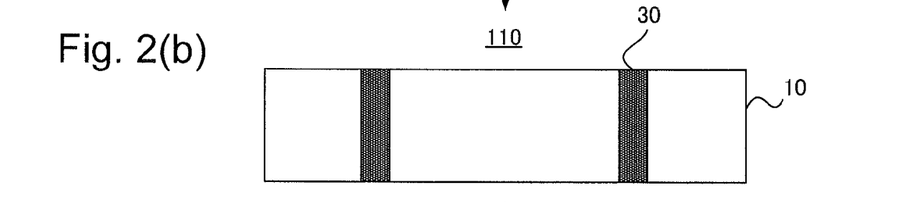
Figure 2C:
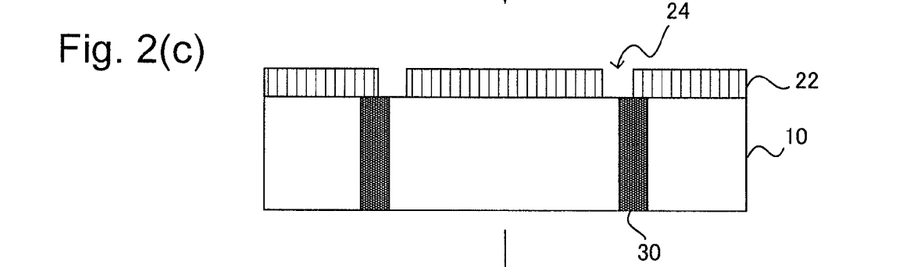
Figure 2D:
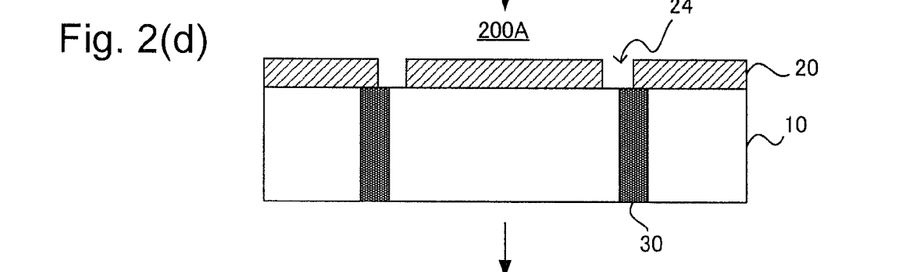

Firstly, a ceramic green sheet 12 is pierced at the predetermined positions to make through holes and then the through holes are filled with a metal paste 32 to produce the first precursor 100. The ceramic green sheet 12 is made from ceramic raw powder as well as a material, as required, which may include sintering additive, organic binder, etc. and formed into a sheet by employing doctor-blade method and the like. As the ceramic raw powder, a known ceramic material can be used without particular limitation. The examples include: (i) oxide series ceramics such as aluminum oxide ceramic, silicon oxide ceramic, calcium oxide ceramic, and magnesium oxide ceramic; (ii) nitride series ceramics such as aluminum nitride ceramic, silicon nitride ceramic, boron nitride ceramic; (iii) beryllium oxide, silicon carbide, mullite, borosilicate glass, and so on. Among them, (ii) nitride ceramics are preferable, as deformation of the green sheet when fired is severe that makes the positional change of via holes significant, effect of the invention is remarkable. Particularly, because of the high thermal conductivity, aluminum nitride ceramics are preferably used.

As a sintering additive, sintering additives to be used depending on the kinds of ceramic raw powder can be used without specific limitation. As an organic binder, polyvinyl butyral, ethyl celluloses and acrylate resins are used; since formability of green sheet becomes favorable, poly-n-butyl methacrylate and polyvinyl butyral are particularly suitably used. When aluminum nitride ceramics as a ceramic raw powder are used in view of favorable thermal conductivity, it is preferable to contain sintering additives like yttrium oxide and calcium oxide to form a green sheet.

The size of the ceramic substrate is adequately determined depending on the application: for instance, if it is a submount substrate, the size is 0.1 mm to 2 mm in thickness, preferably 0.2 mm to 1 mm; and about 1 mm to 10 mm in both length and width. When producing submount substrate, as shown in FIG. 1, it is desirable to produce a plurality of substrate at once. For example, by producing a base material substrate having 10 mm to 100 mm in outer diameter, normally about 50 mm, thereafter cutting into pieces. The size of the ceramic green sheet 12 may be adjusted in consideration of shrinkage in the range between about 15% and 23% when firing.

Method for piercing the ceramic green sheet 12 is not specifically restricted; for instance, method of die blanking or method using a punching machine can be possible. Diameter of the through hole is not particularly limited to; it is about 0.05 mm to 10 mm. In the base material substrate having the outer diameter of 10 mm to 100 mm, amount of misalignment of the via hole from the original position, attributed to shrinkage and/or deformation when the green sheet is fired, is normally about 0.1 mm to 0.3 mm, therefore, in consideration to this amount of misalignment, diameter of the through hole is particularly preferably 0.17 mm to 0.6 mm.

As a metal paste 32 to be filled with the through holes, a known metal paste containing components such as metal powder, organic binder, organic solvent, dispersant, and plasticizer can be used without any limitation. Moreover, in the metal paste, a ceramic powder which is the same type as the one contained in the above-described ceramic green sheet 12 is preferably contained. When the ceramic green sheet 12 and the metal paste 32 contains the same type of ceramic powder, adhesiveness between the ceramic green sheet 12 and the metal paste 32 after sintering improves. Examples of the metal powder contained in the metal paste 32 may be powder of metal such as tungsten, molybdenum, gold, silver, and copper; among them, since the manufacturing method of the invention adopts co-firing method which fires the ceramic green sheet 12 and the metal paste 32 in the through holes simultaneously, powder of high-melting metal having heat resistance to high temperature at a time of firing (like tungsten and molybdenum) can be particularly preferably used.

As an organic binder contained in the metal paste 32, a known organic binder can be used without any limitation. The examples include: acrylic resin such as polyacrylic acid ester and polymethacrylic acid ester; cellulosic resin such as methylcellulose, hydroxymethyl-cellulose, cellulose nitrate, and cellulose-acetate-butyrate; vinyl-containing resin such as polyvinyl butyral, polyvinyl alcohol, and polyvinyl chloride; hydrocarbon resin such as polyolefin; oxygen-containing resin such as polyethylene oxide. These may be used alone or used in combination of two or more thereof.

As an organic solvent contained in the metal paste 32, a known organic solvent can be used without any restriction. For example, toluene, ethyl acetate, terpineol, butyl carbitol acetate, texanol, and so on can be used; a solvent which can easily dissolve the organic binder contained in the metal paste 32 is preferably selected.

As a dispersant contained in the metal paste, a known dispersant can be used without any restriction. The examples thereof include phosphoric ester series dispersant, polycarboxylic acid series dispersant. As a plasticizer contained in the metal paste, a known plasticizer can be used without particular limitation. The examples thereof include dioctyl phthalate, dibutyl phthalate, diisononyl phthalate, diisodecyl phthalate, and dioctyl adipate.

With respect to the method for filling the metal paste 32 into the through holes of the ceramic green sheet 12, a known method is employed without any limitation. For instance, printing method, injection method, and so on may be adopted. When ratio of the length to the diameter of the through hole (length/diameter) is more than 2.5, injection method would be easily carried out; thereby in this respect, injection method is suitably used.

The first precursor 100 thus obtained is fired to make the second precursor 110. As required, degreasing may be carried out before firing.

Degreasing is carried out by thermally treating the first precursor 100 under an oxidized gas such as oxygen and air, reductive gas like hydrogen, inert gas such as argon and nitrogen, carbon dioxide, and a mixture thereof or a humidified gas where water vapor is mixed into a gas. As long as condition of the thermal treatment does not oxidize the high-melting-point metal, these gases can be adequately used. The condition of the thermal treatment, depending on the type and amount of organic components contained in the first precursor 100, is adequately selected within the range of temperature: 250° C. to 1200° C., and holding time: 1 minute to 1000 minutes.

As for the firing which follows the degreasing treatment, depending on the type of ceramic raw powder used for forming the ceramic green sheet 12, conventional conditions are adequately adopted. For example, when the ceramic raw powder is composed of aluminum nitride ceramic, it is just fired at a temperature between 1600° C. and 2000° C., preferably between 1700° C. and 1850° C. for 1 hour to 20 hours, preferably 2 hours to 10 hours. The firing may be carried out under an ambient atmosphere of nonoxidative gas like nitrogen at normal pressures.

As seen above, the second precursor 110 (the sintered ceramic substrate 10 having via holes 30) as a co-fired substrate is produced. About the second precursor 110 produced by the co-firing method, the green sheet 12 is inhomogeneously shrunk at the time of completion of sintering. Hence, positions of the formed via holes 30 is misaligned from the original positions. In the manufacturing method of the ceramic substrate 200A of the present invention, according to the steps shown below, by forming holes or openings 24 at the predetermined positions to correct the positions of the misaligned via hole 30 so as the produced ceramic substrate 200A to meet the requirement of precision wiring.

(Formation of Sintered Ceramic Layer 20)

Over at least one surface of the second precursor 110 produced in the above method, in other words, over the surface where precision surface wiring patterns are formed, the ceramic paste layer 22 having holes or openings 24 whose bottom is configured to be at least a part of exposed end surface of the via holes 30 is provided. Then, the ceramic paste layer 22 is fired to form the sintered ceramic layer 20.

Formation of the ceramic paste layer 22 is carried out by applying a ceramic paste over the surface of the second precursor 110, and as required, drying the coated ceramic paste. As the ceramic paste, a known ceramic paste containing components such as ceramic powder, sintering additive, organic binder, organic solvent, dispersant, and plasticizer may be used without any limitation.

As the ceramic powder contained in the ceramic paste, a known ceramic powder can be used without any limitation. For example, various ceramic powder listed in the description of the ceramic green sheet 12 can be used. Among them, as the ceramic powder, the ceramic powder same as the one which composes the ceramic green sheet 12 is preferably used in view of adhesiveness between the sintered ceramic substrate 10 and the sintered ceramic layer 20 after firing. Alternatively, a ceramic powder for the ceramic paste may be different type from the one which composes the ceramic green sheet 12; depending on the combination of the types, sufficient joint strength can be obtained. For instance, even if different types of ceramic powders are used, in a case where types of the contained cationic component (i.e. metal atom or semimetal atom) are the same, it is possible to obtain high joint strength. Moreover, in a case where the sintered ceramic substrate 10 is a sintered aluminum nitride substrate, aluminum nitride powder, aluminum oxide powder, or a mixture thereof can be used as a ceramic powder contained in the ceramic paste.

As a sintering additive contained in the ceramic paste, one which is used as a sintering additive depending on the type of ceramic powder can be used without any limitation. For example, when the ceramic powder is aluminum nitride powder, oxide of rare-earth element such as yttrium oxide and alkaline earth metal oxide such as calcium oxide may be used.

As the organic binder contained in the ceramic paste, a known organic binder can be used without any restriction. The examples include: acrylic resin such as polyacrilic acid ester and polymethacrylic acid ester; cellulosic resins such as methylcellulose, hydroxymethyl-cellulose, nitrocellulose, and cellulose-acetate-butyrate; vinyl-containing resin such as polyvinyl butyral, polyvinyl alcohol, and polyvinyl chloride; hydrocarbon resin such as polyolefin; and oxygen-containing resin such as polyethylene oxide. These may be used alone or may be used in combination of two or more thereof.

As the organic solvent contained in the ceramic paste, a known organic solvent can be used without any restriction. The examples include toluene, ethyl acetate, terpineol, butyl carbitol acetate, texanol, and acetone.

As the dispersant contained in the ceramic paste, a known dispersant can be used without any limitation. The examples thereof may be phosphoric ester series and polycarboxylic acid series dispersants.

As the plasticizer contained in the ceramic paste, a known plasticizer can be used without any limitation. The examples include dioctyl phthalate, dibutyl phthalate, diisononyl phthalate, diisodecyl phthalate, and dioctyl adipate.

Mixing ratio of the material components in the ceramic paste is not specifically restricted; however, to 100 parts by mass of the ceramic powder, 0.1 to 15 parts by mass of the sintering additive, 6 to 20 parts by mass of the organic binder, 10 to 60 parts by mass of at least one selected from the group consisting of the organic solvent, the plasticizer, and the dispersant is suitable.

Method for preparing the ceramic paste is not particularly restricted as long as it includes the step of mixing each component and is capable of obtaining a paste of homogeneous composition. For instance, known kneading methods like three roll mill and planetary mixer can be adopted.

In the manufacturing method of the present invention, the ceramic paste thus prepared is applied on a predetermined area of at least one surface of the second precursor 110. The term "at least one surface" means a surface for forming a surface wiring pattern (e.g. precision wiring pattern) in the producing ceramic substrate 200A. The ceramic paste is applied over the at least one surface such that it has holes or openings 24 whose bottom is configured to be at least a part of the exposed end surface of the via holes 30. Position of the hole or opening 24 to be formed is the area where a wiring pattern is formed thereon; namely, it is the position where formation of the via hole 30 is originally planned (the original position before misalignment by firing for forming the second precursor 110).

Such application of the ceramic paste can be done by known methods like screen printing, calendar printing, and pad printing. Alternatively, by adopting photolithography process, photoresist mask is formed on the portions to become holes or openings 24, and then application of the ceramic paste can be carried out to the rest of the areas. Thickness of the ceramic paste layer 22 to be formed is not specifically restricted; it is preferably 5 μm to 100 μm. So as to maintain insulation properties at a certain voltage, particularly 10 μm to 50 μm is preferable. These thickness is the thickness before firing so that the paste is shrunk to about 30% to 80% after firing; thickness of the ceramic paste after firing is normally 1 μm to 70 μm, more commonly, it is 3 μm to 40 μm. In case of aluminum nitride, when voltage 500 V is applied to the paste having thickness of about 30 μm, insulation breakdown does not happen; thereby the paste sufficiently meets the function as an insulating layer. Meanwhile, when parts which do not require as high voltage application as the above are mounted, an insulating layer having only about 10 μm can adequately function. In this way, depending on the withstanding voltage between wirings which is required of the mounting parts, optimal thickness can be selected.

The formed ceramic paste layer 22 may be dried before firing. The drying can be suitably carried out by keeping the substrate in air at a temperature between 40° C. and 150° C. for 1 minute to 30 minutes. Firing of the ceramic paste layer 22 can be carried out in the similar conditions to the one set at the production of the above second precursor 110. Also, in the same manner as the production of the above second precursor 110, as required, degreasing can be done before firing.

As above, the sintered ceramic layer 20 is formed over the second precursor 110. In the sintered ceramic layer 20, a plurality of holes or openings 24 are formed. The holes or openings 24 are formed at the positions where via holes 30 are supposed to locate. Hence, by forming holes or openings 24 on the misaligned via holes 30 when producing the above co-fired substrate and by connecting the misaligned via holes 30 with the wiring patterns through the conductive portions 40 formed inside the holes or openings 24, it is possible to correct the positions of the misaligned via holes 30.

(Filling of Metal Paste into Holes or Openings 24)

Figure 2E:
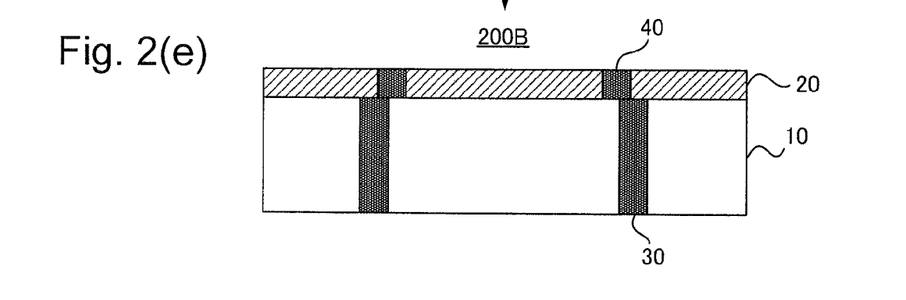

When surface of the substrate 200A is required to be flat, as shown in FIG. 2(e), it is possible to make a ceramic substrate 200B by filling the metal paste into the holes or openings 24 and firing thereof for forming the conductive portion 40. As the metal paste, the similar one used for forming the above via holes 30 can be used.

(Formation of Wiring Patterns 52, 54, 56)

FIGS. 3(a) to 3(e) are explanatory views showing forming steps of wiring pattern 52, 54, 56. As shown in FIGS. 3(a)-3(b), conductive portions 40 may be respectively formed in the holes or openings 24 to form the wiring patterns 52 through conductive portions 40. Alternatively, as shown in FIGS. 3(c)-3(d) as well as FIGS. 3(c)-3(e), the wiring patterns 54, 56 may be directly formed on the holes or openings 24. In this respect, the wiring patterns which exist in the holes or openings 24 becomes conductive portions 40 and the outer wiring patterns of the holes or openings 24 becomes the surface wiring patterns. The method for forming the wiring pattern is printing the metal paste and firing to provide plating on the surface; alternatively, it is a method by a thin film method.

In FIGS. 3(a)-3(b) as well as FIGS. 3(c)-3(d), modes (200C, 200D) for forming wiring patterns by printing metal paste is shown. As the metal paste, the similar metal paste to the one used for forming the above described via holes 30 can be used. In a case where the wiring patterns are formed using the metal paste, since solder wettability on the surface is bad thereby wire bonding and so on cannot be carried out, it is preferable to provide plating like nickel plating and gold plating on the surface of the wiring patterns.

FIGS. 3(c)-3(e) show a mode (200E) in which metallized layers 56 is formed to be the wiring patterns by using thin film method. As the thin film method, known methods can be adopted without any limitation. Specifically, sputtering method, evaporation method, spraying method, as well as sol-gel coating method using spin coat or dipping method may be suitably used. Examples of the materials as necessary laminated constitutions for thin film include: general conductive metal such as Ti, Zr, Pd, Pt, Au, Cu, Ni; resistive element like TaN; solder such as Pb—Sn, Au—Sn, Au—Ge; and metal oxide thin-film (including composite oxide) such as mullite composition film.

With regard to the ceramic substrate, in view of maintaining adhesiveness, it is general to obtain a structure made by the following method, i.e.: firstly, forming an active metal layer, as a ground, made of Ti, Pd, Ta, or the like and then forming thereon the so-called barrier layer from which solder like Pt, Ni never dissolves completely; finally, as required, forming a solder layer made of Au and Au—Sn over the surface.

<Ceramic Substrates 200A to 200E>

The ceramic substrate 200A to 200E of the present invention thus manufactured by the above method comprise the sintered ceramic substrate 10 having the via holes 30 and the sintered ceramic layer 20 having the holes or openings 24 whose bottom is configured to be at least a part of the exposed end surface of the aforementioned via holes 30.

The sintered ceramic substrate 10 (the second precursor 110) having the via holes 30 is produced by forming the through holes at the predetermined positions of the green sheet 12 and filling the metal paste therein; then firing the first precursor 100 by co-firing method. Therefore, the sintered ceramic substrate 10 is inhomogeneously shrunk at the time of firing, whereby positions of the via holes 30 are misaligned from the position where via holes 30 are supposed to be formed. In addition, the sintered ceramic layer 20 is formed by the steps of forming the ceramic paste layer 22 over the surface of the sintered ceramic substrate 10 (the second precursor 110) as a co-fired substrate and firing the resultant by post-firing method. So, since shrinkage of the sintered ceramic layer 20 is inhibited, it is possible to form the holes or openings 24, being the connecting points with the wiring patterns 52, 54, and 56 at the predetermined positions. Moreover, when bottom of the holes or openings 24 is configured to be at least a part of the end surface of the via holes 30 (when bottom of the holes or openings 24 overlap with a part of the end surface of the via holes 30), it is possible to electrically connect the via hole 30 to the surface wiring pattern 52, 54, and 56 without largely increasing the electrical resistance. In this way, the ceramic substrate 200 of the present invention is capable of correcting positions of the via holes 30 which are misaligned by the shrinkage so as to form precision wiring patterns on the surface thereof.

EXAMPLES

Example 1

To 100 parts by mass of aluminum nitride powder, 5.0 parts by mass of yttrium oxide, 1.0 part by mass of tetraglycerin monoolate, 50 parts by mass of toluene, 13 parts by mass of poly-n-butyl methacrylate, 4.2 parts by mass of dibutyl phthalate, and 5.0 parts by mass of butyl acetate were added; and white slurry was obtained. Next, the obtained slurry was used to make a green sheet by doctor-blade method and the produced green sheet was cut into pieces of 60 mm square; then, two of the green sheet each having thickness of 0.35 mm were thermally compressed to produce a green sheet of 0.7 mm in thickness.

In the green sheet, 48 through holes in lengthwise and crosswise, i.e. total 2304 holes were opened at intervals of 1.18 mm by using punching machine with a pin of 0.35 mm in diameter. Into each of the through hole, tungsten paste in which aluminum nitride was added was filled by paste injector. Thereafter, the green sheet having the through holes in which aluminum nitride-added tungsten paste was filled was heated under moisturized hydrogen gas atmosphere at 850° C. for 2 hours and degreasing was carried out. After degreasing, the resultant green sheet was heated and fired under nitrogen atmosphere at 1820° C. for 5 hours to obtain a sintered aluminum nitride substrate having tungsten vias. Both sides of the sintered substrate were polished using lapping/polishing machine and finally a 0.35 mm thick sintered aluminum nitride substrate having tungsten vias was produced.

Following to it, 100 parts by mass of aluminum nitride powder having average diameter of 1.5 μm, 5.0 parts by mass of yttrium oxide powder having average diameter of 0.5 μm, 7.7 parts by mass of ethyl cellulose, 54 parts by mass of terpineol, and 1.5 parts by mass of dispersant were kneaded; an aluminum nitride paste whose viscosity at 25° C. is 70 Pa-s was prepared. By using the prepared aluminum nitride paste, pattern printing was carried out over one surface of the sintered aluminum nitride substrate having the above tungsten vias to form an aluminum nitride paste layer.

The printing pattern of aluminum nitride was determined by the following method. As it were, first of all, a green sheet which was same as the one separately formed in the above description having through holes filled with tungsten paste was degreased under the same condition as above (heating under moisturized hydrogen gas atmosphere at 850° C. for 2 hours) and fired (heating under nitrogen atmosphere at 1820° C. for 5 hours) then, shrinkage ratio of a side of the resultant sintered substrate was measured (84.7%). Next, scaling position was assumed such that X axis and y axis cross at right angles at the center of green sheet (center point (0, 0)), and coordinate of center of each via in the green sheet was found. After that, by multiplying each of the determined x-coordinate and y-coordinate by the above shrinkage ratio, the coordinates, where each via center was supposed to be located if green sheet was assumed to be evenly shrunk in both lengthwise and crosswise direction, were determined. Finally, patterns were made such that openings (holes) of 0.3 mm in diameter were provided to those coordinates. When inside the holes was visually observed after formation of aluminum nitride paste layer, in all of the holes, at least a part of the end surface of the ground via holes was observed. After forming the aluminum nitride paste layer, all of the holes were filled with the tungsten paste (the same one used for producing the sintered aluminum nitride substrate having tungsten vias.). Height of the tungsten paste layer and that of the aluminum nitride paste layer were made the same.

Thereafter, the resultant was dried at 100° C. for 5 minutes; when film thickness of the aluminum nitride paste layer was measured, the average film thickness was 12 μm. The sintered aluminum nitride substrate having aluminum nitride paste layer, on one surface, having holes filled with tungsten paste, thus obtained, was heated and fired under nitrogen atmosphere at 1780° C. for 4 hours. Hence, an aluminum nitride substrate having the sintered aluminum nitride layer having holes filled with the tungsten sintered body inside was obtained. Average film thickness of the sintered aluminum nitride layer was 8 μm.

Figure 4:
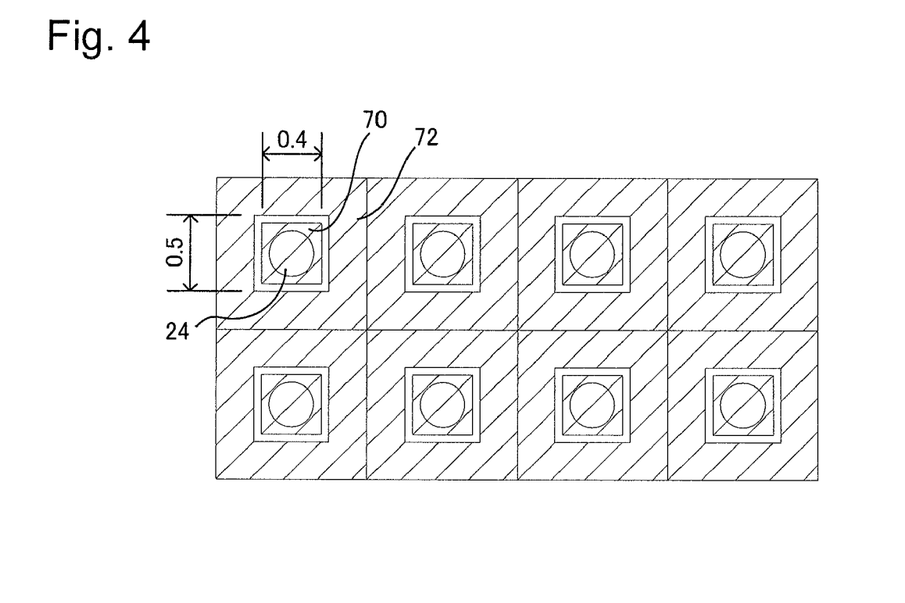
FIG. 4 is a plain view of wiring patterns formed in an Example.

On the surface of the sintered aluminum nitride layer, wiring patterns as shown in FIG. 4 were formed. It should be noted that in FIG. 4, a part of the wiring patterns is only shown for convenience in explanation. In reality, these wiring patterns were formed on every single through hole, i.e. 48 holes each in lengthwise and crosswise, in total of 2304 holes. Firstly, by using sputtering apparatus, 0.06 μm-thick Ti layer, 0.2 μm-thick Pt layer, and 0.5 μm-thick Au layer, in the written order, were respectively coated on both surfaces of the obtained aluminum nitride substrate. Later, on one surface where the sintered aluminum nitride layer having holes was formed, a positive-type resist was coated by using spin coater to form a resist layer. Next, with the predetermined mask pattern, to the circumference of each hole of the sintered aluminum nitride layer, quadracyclic resist absentee chases having 0.05 mm in chase width and 0.5 mm on one side from the planar view were formed. To the substrate having the resist layer in which the resist absentee chases were formed, milling treatment was carried out. Then, a set of Ti layer/Pt layer/Au layer exposed at the resist absentee chases portion was removed. Thereafter, the resist was peeled using acetone and the aluminum nitride substrate, to which the wiring patterns including the surface wiring patterns 70 on the conductive portions and the outer wiring patterns 72 were formed and which has tungsten vias, was obtained.

When electrical characteristics of the substrate was tested, the surface wiring pattern 70 on the conductive portion and the outer wiring pattern 72 maintained those electrical insulating property (10 MΩ or more) at all of the 2304 points.

Example 2

In the same manner as Example 1, the aluminum nitride paste was applied to the sintered aluminum nitride substrate having tungsten vias, then each of the tungsten via was filled with the tungsten paste and dried so as to produce a sintered aluminum nitride substrate having "an aluminum nitride paste layer having holes filled with the tungsten paste" on one surface.

Next, to 100 parts by mass of tungsten powder whose average diameter was 2.2 μm, 5.3 parts by mass of aluminum nitride powder whose average diameter was 1.5 μm, 1.8 parts by mass of ethylcellulose, 10 parts by mass of terpineol, and 0.8 parts by mass of dispersant were mixed and kneaded. Thus, a tungsten paste whose viscosity at 25° C. was 100 Pa·s was prepared; the tungsten paste was printed on the surface having the aluminum nitride paste layer in a form of the wiring pattern (wiring pattern shown in FIG. 4) same as the one by the metallized layer in Example 1 and then the printed patterns were dried in the air at 100° C. for 5 minutes. On the other hand, back side was entirely covered with the tungsten paste.

The obtained substrate was heated under nitrogen atmosphere at 1780° C. for 4 hours to obtain an aluminum nitride substrate to which wiring patterns were printed and which have tungsten via.

When electrical characteristics of the substrate was tested, the surface wiring pattern 70 on the conductive portion and the outer wiring pattern 72 maintained those electrical insulating property (10 MΩ or more) at all of the 2304 points.

Example 3

In the same manner as Example 1, the aluminum nitride paste was applied to the sintered aluminum nitride substrate having tungsten vias, then the tungsten vias were filled with the tungsten paste and dried so as to produce a sintered aluminum nitride substrate having "an aluminum nitride paste layer having holes filled with the tungsten paste" on one surface. In this case, the aluminum nitride paste was doubly-coated. Average film thickness of the dried aluminum nitride paste layer determined in the same manner as Example 1 was 20 μm. The obtained sintered aluminum nitride substrate having the aluminum nitride paste layer on one surface was fired and metallized in the same manner as Example 1; later, an aluminum nitride substrate on which wiring patterns were formed and which have the tungsten vias.

When electrical characteristics of the substrate was tested, the surface wiring pattern 70 on the conductive portion and the outer wiring pattern 72 maintained those electrical insulating property (10 MΩ or more) at all of the 2304 points.

Comparative Example 1

Except for using the sintered aluminum nitride substrate having tungsten vias as it is without forming the sintered aluminum nitride layer and except for forming a combination of Ti layer/Pt layer/Au layer on both sides thereof, wiring pattern was formed in the same manner as Example 1.

When electrical characteristics of the substrate was tested, the pattern on the tungsten via and the outer wiring pattern were short-circuited at 664 points. The locations of short-circuiting were mostly periphery region of the substrate.

The above has described the present invention associated with the most practical and preferred embodiments thereof. However, the invention is not limited to the embodiments disclosed in the specification. Thus, the invention can be appropriately varied as long as the variation is not contrary to the subject substance and conception of the invention which can be read out from the claims and the whole contents of the specification. It should be understood that the ceramic substrate manufacturing method and ceramic substrate with such an alternation are included in the technical scope of the invention.

INDUSTRIAL APPLICABILITY

About a substrate used for mounting electronic components, with miniaturization of parts to be mounted, higher accuracy and higher fineness of the wiring pattern are required. Therefore, about the connecting points between the wiring patterns and the via holes, the positioning must be highly accurately controlled so as to assure electrical connection. The method for manufacturing ceramic substrate and the ceramic substrate can respond to the requirement.

The invention claimed is:

1. A method for manufacturing a ceramic substrate having a via hole and a surface wiring pattern electrically connected to the via hole, the method comprising the steps of:
    preparing a sintered ceramic substrate having a via hole;
    forming on the sintered ceramic substrate a sintered ceramic layer having a hole or opening at least a part of whose bottom is at least a part of exposed end surface of the via hole by post-firing method;
    forming inside the hole or opening a conductive portion which electrically connects the surface of the sintered ceramic layer and the via hole; and
    forming on the surface of the sintered ceramic layer a surface wiring pattern electrically connected to the conductive portion,
    wherein the step of preparing the sintered ceramic substrate having a via hole comprises the steps of: piercing a ceramic green sheet at a predetermined position; filling a metal paste into the pierced hole to form a first precursor; and firing the first precursor to form a second precursor having a via hole,
    and wherein the step of forming the sintered ceramic layer by post-firing method comprises the steps of: forming on the sintered ceramic substrate having a via hole a ceramic paste layer having a hole or opening at least a part of whose bottom is at least a part of exposed end surface of the via hole; and firing the ceramic paste layer.

2. The method according to claim 1, wherein the ceramic for forming the ceramic green sheet and the ceramic paste layer is aluminum nitride.

3. The method according to claim 1, wherein forming of the conductive portion and the sintered ceramic layer is carried out simultaneously.

4. The method according to claim 3, wherein in the step of forming the sintered ceramic layer by post-firing method, by filling a metal paste into the hole or opening to form a metal paste layer and firing the obtained metal paste layer together with the ceramic paste layer, forming of the conductive portion and the sintered ceramic layer is carried out simultaneously.

5. The method according to claim 4, wherein formation of the ceramic paste layer and formation of the metal paste layer are repeated alternately,
    a first hole or opening is provided in the first ceramic paste layer such that the diameter is to become equal to or larger than that of the via hole so that the bottom of the first hole or opening covers the entire area of the end surface of the via hole, and
    an upper hole or opening is provided in a ceramic paste layer to be formed above the first layer such that the diameter is to become smaller than that of a metal paste layer existing in a closest ceramic paste layer below the ceramic paste layer in order to form the entire area of the bottom of the upper hole or opening with the surface of the metal paste layer.

6. The method according to claim 1, wherein forming of the conductive portion and the surface wiring pattern is carried out simultaneously.

7. The method according to claim 1, wherein forming of the conductive portion, the sintered ceramic layer, and the surface wiring pattern is carried out simultaneously.

8. The method according to claim 1, wherein the step of forming the surface wiring pattern is either by the steps of printing a metal paste, firing the printed metal paste, and the plating on the surface thereof or by the step of forming a metallized layer to be the wiring pattern by thin film method.

* * * * *